United States Patent [19]
Nabatian et al.

[11] Patent Number: 5,922,627
[45] Date of Patent: *Jul. 13, 1999

[54] LOW RESISTIVITY PALLADIUM-SILVER COMPOSITIONS

[75] Inventors: David J. Nabatian, Wayne, N.J.; Orville W. Brown, Lansdale; James E. Durant, New Hope, both of Pa.

[73] Assignee: National Starch and Chemical Investment Holding Corporation, Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 08/953,586

[22] Filed: Oct. 17, 1997

[51] Int. Cl.$^6$ .................................. C03C 8/14; C03C 8/18
[52] U.S. Cl. ................................ 501/17; 501/19; 501/22; 501/23; 501/21; 501/26; 501/32; 252/514
[58] Field of Search ................................... 501/17, 19, 22, 501/26, 23, 21, 32, 67, 68, 69, 70, 75, 76, 77, 79; 252/514; 428/208, 901; 338/20, 21, 224

[56] References Cited

U.S. PATENT DOCUMENTS

| | | |
|---|---|---|
| 3,909,680 | 9/1975 | Tsunashima ........................ 317/101 C |
| 4,285,731 | 8/1981 | Nigrin ........................................ 501/26 |
| 4,578,619 | 3/1986 | Braude ...................................... 501/79 |
| 4,728,534 | 3/1988 | Ho et al. .................................. 427/103 |
| 4,831,432 | 5/1989 | Hori et al. ................................. 357/67 |
| 5,221,644 | 6/1993 | Berlin et al. .............................. 501/19 |
| 5,264,272 | 11/1993 | Tanabe et al. ............................ 501/66 |
| 5,306,674 | 4/1994 | Ruderer et al. ........................... 501/79 |
| 5,341,119 | 8/1994 | Berlin et al. ............................ 338/224 |
| 5,345,212 | 9/1994 | Brown ....................................... 338/20 |
| 5,366,813 | 11/1994 | Berlin ...................................... 428/546 |
| 5,376,596 | 12/1994 | Tokuda et al. ............................ 501/19 |
| 5,393,558 | 2/1995 | Allison et al. ........................... 501/76 |
| 5,464,564 | 11/1995 | Brown ..................................... 252/514 |
| 5,622,547 | 4/1997 | Maslowski et al. .................. 106/20 B |
| 5,677,250 | 10/1997 | Knapp ....................................... 501/79 |

OTHER PUBLICATIONS

Abstract: Charles C.Y. Kuo and Tom O. Martin, CTS Corporation, Elkart,Indiana, "Thick Film Allow Resistor Systems for Surge Protection—Part II", ISHM Proceedings, pp. 438–444, 1990 (no month).

*Primary Examiner*—Michael Marcheschi
*Attorney, Agent, or Firm*—Jane E. Gennaro

[57] ABSTRACT

Glass frits containing lithium are used in thick film palladium-silver compositions which after firing result in conductors or resistors that exhibit very low resistivity and TCR.

6 Claims, No Drawings

LOW RESISTIVITY PALLADIUM-SILVER COMPOSITIONS

FIELD OF THE INVENTION

This invention relates to thick film palladium-silver compositions, particularly to compositions containing lithium-bearing glasses, for use as resistors or conductors in electronic circuits.

BACKGROUND OF THE INVENTION

Thick film palladium-silver compositions are used in the manufacture of resistor or conductor elements, which have a variety of applications. Exemplary applications include the dissipation of the secondary voltage surge that occurs when lightning hits telecommunication wires; the sensing of changes in electrical current in circuits, where changes in current flow can be utilized to switch circuits or determine battery charge in portable electronics; electrically conductive termination for ruthenium based thick film resistors; and low temperature heating elements.

In a majority of such applications, low resistivity, below 1000 milliohms per square, is needed for good conduction of electrical current. For small, efficient circuits, a resistivity below 100 milliohms per square is needed. In addition, a low temperature coefficient of resistance (TCR), usually below 100 ppm/°C., is required to keep the resistance constant over a given temperature range. The lower limit of the temperature range is traditionally defined as −55° C. or −40° C., the ambient temperature encountered in cold regions of the earth. The upper temperature limit is traditionally defined as +125° C., a temperature that the entire assembled circuit is likely to encounter either due to heat generation by the circuit itself or by proximity to a heat source, such as in an under-the-hood automotive application.

It is known that low TCR can be achieved for thick film compositions by selecting a particular weight ratio of palladium to silver components in the composition, typically in the range of about 56/44 to about 60/40. The ordinary glass binder systems used in these thick film compositions typically comprise, in a major portion, $SiO_2$, PbO, and $Al_2O_3$, and in a minor portion, CaO, $B_2O_3$, $Na_2O$, $K_2O$, and MgO. Within this Pd/Ag ratio range, and using ordinary glass binder systems used in thick film compositions, sheet resistivities in excess of 100 milliohms per square generally result.

SUMMARY OF THE INVENTION

This invention relates to a lithium-bearing glass frit binder system for thick film palladium/silver resistor or conductor compositions, in which the binder system comprises to a total of 100 parts by weight: 1 to 25, preferably about 5 to about 15 parts by weight $Li_2O$; 7 to 70, preferably about 25 to about 50 parts by weight $B_2O_3$; and 5 to 40, preferably about 10 to about 30 parts by weight $SiO_2$.

To a total of 100 parts by weight, the thick film resistor or conductor compositions will comprise: (i) the glass frit binder system, present in amounts of about 2 to 17 parts, preferably from about 2.5 to about 6 parts by weight; (ii) a mixture of palladium and silver in a palladium to silver weight ratio in the range of about 55/45 to about 63/37, present in amounts of about 74 to 90 parts; and (iii) the remainder of organic vehicle.

DETAILED DESCRIPTION OF THE INVENTION

In currently used thick film compositions containing borosilicate glasses, the glass frits are devoid of lithium and in most cases contain PbO as a fluxing agent. It has now been demonstrated that when borosilicate glass frits containing lithium are used in thick film palladium-silver compositions, the resulting fired films unexpectedly exhibit very low resistivity compared to films prepared from inks that do not contain such lithium-bearing glasses. The films adhere very well to standard alumina substrates used for thick film circuits, and their dense structure provides excellent ability to withstand and dissipate electrical power.

In addition to the oxides of $Li_2O$, $B_2O_3$, and $SiO_2$, other modifying oxides may be added to the glass binder, singly or in combination, to enhance the sintering ability of the glass. Such modifying oxides; in parts per hundred by weight of the glass binder, will be: Na2O from 0 to about 15; K2O from 0 to about 20 ; CaO from 0 to about 6; Cr2O3 from 0 to about 2; ZrO2 from 0 to about 5; MgO from 0 to about 5, ZnO from 0 to about 8; SrO from 0 to about 8; CdO from 0 to about 15; PbO from 0 to 30; Bi2O3 from 0 to about 25; Al2O3 from 0 to about 5.

The glass binders are prepared by blending, typically in a V-blender or jar mill, commercially available oxides, or carbonates, (e.g. such as those available from Fisher Scientific, Fair Lawn, N.J.), and firing the mixture in a crucible to about 800° C.–1000° C. The melt is quenched in water and the resulting glass frit is ball milled to an average particle size of about 1–4 microns.

The silver and palladium are used in the form of commercially available powders, preferably being spherical in shape, such as those available from Degussa, South Plainfield, N.J. The average particle size for the palladium and silver preferably will be less than one micron, but may be as large as several microns. The silver and the palladium also may be in the form of co-precipitated or pre-alloyed powder or powders, having in total a Pd/Ag ratio from 55/45 to 63/37.

Good dispersion of the fine powders and resulting good screen transfer are achieved by suspending the powders in an organic vehicle, such as are known and used in the art for this purpose. Exemplary organic vehicles for thick film inks are made of cellulosic, acrylic, or phenolic resins, which are dissolved in high boiling solvents, such as, terpene alcohols, oils, or ether alcohols. Additives, such as, thixotropes or surface active agents, which usually are amines, waxes, fatty acids, and like materials, can be incorporated into the vehicles to improve dispersion of the powder.

The most common resin used in such organic vehicles is ethyl cellulose, which can be commercially obtained in a range of molecular weights to provide a range of viscosities. Exemplary resins that are commercially available include the N, K, and T series of ethyl celluloses available from Aqualon, A Division of Hercules, Inc., Wilmington, Del. Other commonly used resins are ethylhydroxyethyl cellulose, wood rosin, and mixtures of ethyl cellulose with acrylic resins, particularly the polymethacrylates of lower alcohols and monobutyl ether of ethylene glycol monoacetate.

The commonly used solvents are terpene alcohols, pine oil, mineral oil, and ether alcohols that boil in the range of 130°–350° C. Exemplary solvents, used independently or in combination are diethylene glycol monobutyl ether, diethylene glycol dibutyl ether, diethylene glycol monobutyl ether acetate, dibutyl phthalate, dioctyl phthalate, dimethyl phthalate, butyl diglyme, and the like.

Optionally, the organic vehicle will contain one or more esters of fatty acids, particularly tall oil fatty acids, substituted for a portion of the usual organic solvent. It is possible for the solvent to comprise 1–90% of esters of fatty acids, where the alcohol of esterification is a $C_1$–$C_6$ alkyl, (methyl, ethyl, butyl, 2-ethyl hexyl, and the like).

Dispersant and rheology control agents may be added, and are used in small quantities at about 0.05–1.0% of the total ink weight. Commonly used additives are triethylamine, hydrogenated caster oil, oleic acid, stearic acid, and paraffin.

Thus, an exemplary organic vehicle may comprise by weight 1–40% resin, 99–60% solvent, and optionally 0.1–20% of additives;

EXAMPLES

Several glass frits containing varied percentages of oxides were prepared as described in this specification. These were utilized, along with fine grain palladium (average particle size less than one micron, supplied as 7100-24 by Degussa, South Plainfield, N.J.) and silver ( average particle size less than one micron, supplied as 3000-2 by Degussa), to make inks with various frit content and Pd/Ag ratio.

Example 1

Glass Frit Compositions

Oxides and carbonates were blended, placed in a platinum crucible and heated to 900° C. in a box furnace. The resulting melts were quenched in water and ball-milled to the desired particle size. The composition (adjusted for the volatilization of $CO_2$ when carbonates were used as the starting material) and average particle sizes in microns for the frits are recorded in Table 1.

TABLE 1

| Oxides | Frit #1 | Frit #2 | Frit #3 | Frit #4 | Frit #5 | Frit #6 | Frit #7 |
|---|---|---|---|---|---|---|---|
| $LiO_2$ | 5.0 | 25.0 | 20.0 | 1.0 | 10.0 | 9.8 | 8.6 |
| $B_2O_3$ | 70.0 | 33.0 | 10.0 | 43.0 | 7.0 | 43.7 | 45.0 |
| $SiO_2$ | 5.0 | 40.0 | 10.0 | 20.0 | 18.0 | 21.9 | 18.7 |
| $Na_2O$ | 3.0 | — | 15.0 | — | 1.0 | — | — |
| $K_2O$ | 7.0 | 2.0 | 20.0 | — | — | 10.8 | 11.1 |
| CaO | 2.0 | — | — | 6.0 | — | 1.5 | 2.5 |
| $Cr_2O_3$ | — | — | — | — | — | 1.9 | — |
| $ZrO_3$ | — | — | — | — | — | — | 5.00 |
| MgO | — | — | — | — | 7.0 | — | 1.9 |
| ZnO | — | — | — | — | 8.0 | — | — |
| SrO | 2.0 | — | 8.0 | — | 8.0 | 6.8 | 3.5 |
| CdO | — | — | — | — | 15.0 | — | — |
| PbO | — | — | 15.0 | 30.0 | — | — | — |
| $Bi_2O_3$ | — | — | — | — | 25.0 | — | — |
| $Al_2O_3$ | 5.0 | — | 2.0 | — | 1.0 | 3.6 | 3.7 |
| Average particle size | 1.5 | 4.1 | 1.8 | 1.0 | 2.4 | 3.2 | 4.0 |

Example 2

Pd/Ag Ink Compositions With 2% Glass Frits

Using several of the glass frits from Example 1, thick film palladium-silver (Pd/Ag) inks were prepared, screen printed on alumina substrate, and fired at 850° C. using conventional thick film equipment and techniques. The Pd/Ag ratio was 60/40, the mixture of both metals totaling 89.5 parts per hundred by weight of the total ink. The frit powders comprised 2 parts per hundred of the ink. The balance was made up of organic vehicle. The sheet resistivity and TCR of these compositions were determined and are listed in Table 2. These values can be compared to those obtained in U.S. Pat. Nos. 5,341,119 and 5,221,644, examples listed in Tables I and II of those references using 5% glass frit. As can be determined from the specification of these references, the glass frits used are composed of $SiO_2$, PbO, and $Al_2O_3$, and do not contain $Li_2O$ as in the instant invention. The data show that the inventive compositions comprising the lithium-bearing borosilicate glass frits give lower sheet resistivities than those of the references in which the sheet resistivity for 5% glass frit is given as 40 and 44 milliohms per square.

TABLE 2

| | Sheet Resistivity | TCR ppm/oC | | |
|---|---|---|---|---|
| Frit#. | milliohms/square | to −55° C. | to −40° C. | to +125° C. |
| 1 | 28.6 | 62 | 49 | 2 |
| 2 | 31.3 | 50 | 33 | 3 |
| 3 | 29.3 | 69 | 55 | 23 |
| 4 | 28.7 | 60 | 50 | 3 |
| 5 | 26.6 | 70 | 56 | 42 |

Example 3

Pd/Ag Ink Compositions With 17% Glass Frits

Another set of inks was prepared and tested similarly to those of Example 2, except that the amount of glass frits was raised to 17 parts per hundred by weight of the ink; the amount of palladium and silver was reduced correspondingly. The palladium to silver ratio was kept at 60/40. The fired films were tested for resistivity and TCR. The data are summarized in Table 3 and show that even with a high level of glass frits, the sheet resistivities remain low.

TABLE 3

| | Sheet Resistivity | TCR ppm/° C. | | |
|---|---|---|---|---|
| Frit # | milliohms/square | to −55° C. | to −40° C. | to +125° C. |
| 1 | 106 | 37 | 27 | 12 |
| 2 | 92 | 183 | 179 | 159 |
| 3 | 116 | 374 | 388 | 290 |
| 4 | 110 | 33 | 24 | 2 |
| 5 | 63 | 92 | 87 | 93 |

Example 4

Variations in Pd/Ag Ratio

Variations in Pd/Ag ratios were examined. Inks were prepared to contain 4.5 parts per hundred of glass frit #1, 87 parts per hundred of the palladium and silver mixture in various ratios, and the balance of organic vehicle. The inks were tested as in Example 2. The results and the Pd/Ag ratio are reported in Table 4 and show that through the range of Pd/Ag ratios tested, the sheet resistivities (and TCR values) are very low.

TABLE 4

| | Sheet Resistivity | TCR ppm/° C. | | |
|---|---|---|---|---|
| Pd/Ag | milliohms/square | to −55° C. | to −40° C. | to +125° C. |
| 55/45 | 30.2 | 50 | 34 | 47 |
| 60/40 | 34.2 | 74 | 69 | 4 |
| 63/37 | 34.9 | 131 | 112 | 110 |

Example 5

Performance of Pd/Ag Ink Compositions

The thick film ink compositions in this example were tested for resistivity and TCR, as well as surge protection and soldered adhesion. The Pd/Ag ratio was 57/43 for all compositions.

All compositions accepted solder and leached less than 5% after seven 10-second immersions in 62:36:2 Pb:Sn:Ag solder.

All compositions gave adhesion to alumina substrate. The adhesion was measured by soldering 20 gauge tinned copper wire onto 0.2cm×0.2cm pads of the thick film composition and pulling the wire in a perpendicular direction to the pad until failure. The force was measured at failure in Newtons per square centimeter.

To test for suitability in the fabrication of lightning surge protection devices, parts were surged 20 times using 2/10 microsecond waveform at 2500 volts and 100 times using 10/1000 microsecond waveform at 1000 volts. Small changes in resistance shift were measured and recorded as percent change in resistance.

The data are reported in Table 5.

TABLE 5

| Frit # | Percent in composition frit | Percent in composition solids | Sheet Resistivity milliohms/ square | TCR ppm/° C. to −55° C. | TCR ppm/° C. to +125° C. | % Change in Resistance 2/10 2500 V | % Change in Resistance 10/1000 1000 V | Soldered Adhesion Newtons/ cm² |
|---|---|---|---|---|---|---|---|---|
| 5 | 3.0 | 91.5 | 31.2 | 98 | 24 | .75 | .16 | 618.75 |
| 2 | 6.0 | 91.5 | 36.7 | 38 | 41 | .44 | .43 | 528.75 |
| 6 | 2.5 | 80.0 | 62.1 | 45 | 29 | .02 | .12 | 157.25 |
| 6 | 3.0 | 92.0 | 30.0 | 48 | 55 | .17 | .38 | 337.50 |
| 7 | 4.2 | 90.2 | 34.1 | 36 | 52 | .12 | .08 | 517.50 |

Statement of Commercial Utility: The conductors and resistors resulting from the thick film compositions and glass frits of this invention are fired to make circuits that are useful in the manufacture of lightning surge protection devices, sense resistors used for measuring changes in current flow, heating elements, and electrically conductive terminations for ruthenium based thick film resistors.

We claim:

1. A method for reducing the sheet resistivity of a palladium/silver composition having a palladium to silver weight ratio in the range of about 55/45 to about 63/37 and containing a borosilicate glass frit binder, the method comprising adding to the glass frit binder about 1 to 25 parts by weight of lithium oxide per 100 parts by weight of glass frit binder.

2. The method according to claim 1 in which the lithium oxide is added to the glass frit binder in an amount of 5 to 15 parts by weight of the glass frit binder.

3. The method according to claim 1 in which the glass frit binder is present in an amount of about 2 to 17 parts by weight per 100 parts by weight of the palladium/silver composition.

4. The method according to claim 3 in which the glass frit binder is present in an amount of about 2.5 to 6 parts by weight per 100 parts by weight of the palladium/silver composition.

5. The method according to claim 1 in which the borosilicate glass frit binder further comprises $Na_2O$ present in an amount from 0 to about 15 parts by weight;

$K_2O$ present in an amount from 0 to about 20 parts by weight;

CaO present in an amount from 0 to about 6 parts by weight;

$Cr_2O_3$ present in an amount from 0 to about 2 parts by weight;

$ZrO_2$ present in an amount from 0 to about 5 parts by weight;

MgO present in an amount from 0 to about 5 parts by weight,

ZnO present in an amount from 0 to about 8 parts by weight;

SrO present in an amount from 0 to about 8 parts by weight;

CdO present in an amount from 0 to about 15 parts by weight;

PbO present in an amount from 0 to about 30 parts by weight $Bi_2O_3$ present in an amount from 0 to about 25 parts by weight; and $Al_2O_3$ present in an amount from 0 to about 5 parts by weight.

6. The method according to claim 1 in which the glass frit binder is present in the composition at 2 parts per 100 and the sheet resistivity is reduced to about 30 milliohms/square or less.

* * * * *